(12) United States Patent (10) Patent No.: US 9,052,342 B2
Fan et al. (45) Date of Patent: Jun. 9, 2015

(54) PROBE WITH CANTILEVERED BEAM HAVING SOLID AND HOLLOW SECTIONS

(75) Inventors: Li Fan, Livermore, CA (US); Rui Xu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 727 days.

(21) Appl. No.: 13/250,756

(22) Filed: Sep. 30, 2011

(65) Prior Publication Data

US 2013/0082729 A1 Apr. 4, 2013

(51) Int. Cl.
*G01R 31/00* (2006.01)
*G01R 1/067* (2006.01)

(52) U.S. Cl.
CPC ........ *G01R 1/06727* (2013.01); *G01R 1/06744* (2013.01)

(58) Field of Classification Search
None
See application file for complete search history.

(56) References Cited

U.S. PATENT DOCUMENTS

| | | | |
|---|---|---|---|
| 4,362,353 A | 12/1982 | Cobaugh et al. | |
| 4,618,821 A | 10/1986 | Lenz | |
| 5,286,208 A | 2/1994 | Matsuoka | |
| 6,945,827 B2 | 9/2005 | Grube et al. | |
| 7,063,541 B2 * | 6/2006 | Grube et al. | 439/66 |
| 7,371,072 B2 | 5/2008 | Mathieu et al. | |
| 7,628,620 B2 | 12/2009 | Gritters | |
| 7,841,863 B2 | 11/2010 | Mathieu et al. | |
| 7,850,460 B2 | 12/2010 | Weiland et al. | |
| 7,851,794 B2 | 12/2010 | Hobbs | |
| 2005/0179458 A1 | 8/2005 | Chen et al. | |
| 2007/0200576 A1 | 8/2007 | Laurent et al. | |
| 2008/0106289 A1 | 5/2008 | Khoo et al. | |
| 2009/0079455 A1 | 3/2009 | Gritters | |
| 2011/0148449 A1 | 6/2011 | Williams et al. | |

FOREIGN PATENT DOCUMENTS

| | | |
|---|---|---|
| JP | 2009-229410 | 10/2009 |
| WO | WO 02/058137 | 7/2002 |
| WO | WO 2006/026346 | 3/2006 |

OTHER PUBLICATIONS

Int'l Search Report and Written Opinion of the Int'l Searching Authority, PCT/US2012/057255, Mar. 11, 2013 (14 pages).
U.S. Appl. No. 13/288,925, filed Nov. 3, 2011, Beinlinger.

* cited by examiner

*Primary Examiner* — Paresh Patel
(74) *Attorney, Agent, or Firm* — N. Kenneth Burraston; Kirton McConkie

(57) ABSTRACT

An electrically conductive probe can comprise a post to which a beam structure is attached. The beam structure can comprise a cantilevered portion that extends away from the post to a free end to which a contact structure can be attached. The cantilevered portion of the beam can include both a solid section and a hollow section. Multiple such probes can be used in a test contactor to make electrical connections with an electronic device such as a semiconductor die or dies to be tested.

26 Claims, 12 Drawing Sheets

PROBE WITH CANTILEVERED BEAM HAVING SOLID AND HOLLOW SECTIONS

BACKGROUND

Electrically conductive probes can be used to establish electrical connections between electronic devices. For example, a test contactor device such as a probe card assembly comprising electrically conductive probes can be used to make electrical connections with electronic devices for the purpose of testing the electronic devices. Testing of newly manufactured semiconductor dies is one example of a test application in which electrically conductive probes are pressed into contact with pads, bumps, or other such electrical terminals of electronic devices (in this example, semiconductor dies) to connect electrically the probes to the electrical terminals of the device. The electronic devices can then be tested, operated, or otherwise exercised by providing power and signals to the electronic devices through the probes. In some such test applications, it can be advantageous to, among other things, reduce stress in the probes and/or control scrub (a wiping action) of the probes on the terminals as the terminals and probes are brought into contact. It can also be advantageous in some test applications to reduce a pitch of (distance between) contact tips of adjacent probes. Some embodiments of the invention disclosed in this application may address one or more of the foregoing issues.

SUMMARY

In some embodiments, an electrical probe can include an electrically conductive post, an electrically conductive beam structure, and an electrically conductive contact structure. The beam structure can include an attachment portion attached directly to an end of the post and a free cantilevered portion extending directly away from the attachment portion. The cantilevered portion, which can be disposed along an axis that is substantially perpendicular to an axis along which the post is disposed, can include both a solid section and a hollow section. The contact structure can be attached directly to and extend from a free end of the beam structure.

In some embodiments, a test contactor can include an electrical interface to a tester, a substrate, and electrically conductive probes. Each probe can include an electrically conductive post, an electrically conductive beam structure, and an electrically conductive contact structure. The beam structure can include an attachment portion attached directly to an end of the post and a free cantilevered portion extending directly away from the attachment portion. The cantilevered portion, which can be disposed along an axis that is substantially perpendicular to an axis along which the post is disposed, can include both a solid section and a hollow section. The contact structure can be attached directly to and extend from a free end of the beam structure.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Inventions disclosed in this application include electrically conductive probes that can be used to establish electrical connections with an electronic device, apparatuses in which such probes can be used, uses of such probes, and processes for making such probes and apparatuses. In some embodiments, an electrically conductive probe can comprise a post to which a beam structure is attached. The beam structure can comprise a cantilevered portion that extends away from the post to a free end to which a contact structure can be attached. The cantilevered portion of the beam can include both a solid section and a hollow section. The presence of the solid section can tend to reduce stresses in the beam structure that can arise as the cantilevered portion bends in response to a force on the contact structure caused by, for example, contact with a terminal of an electronic device. The presence of the hollow section can tend to reduce a length of scrub of the contact tip structure on the terminal.

Figure 1A:
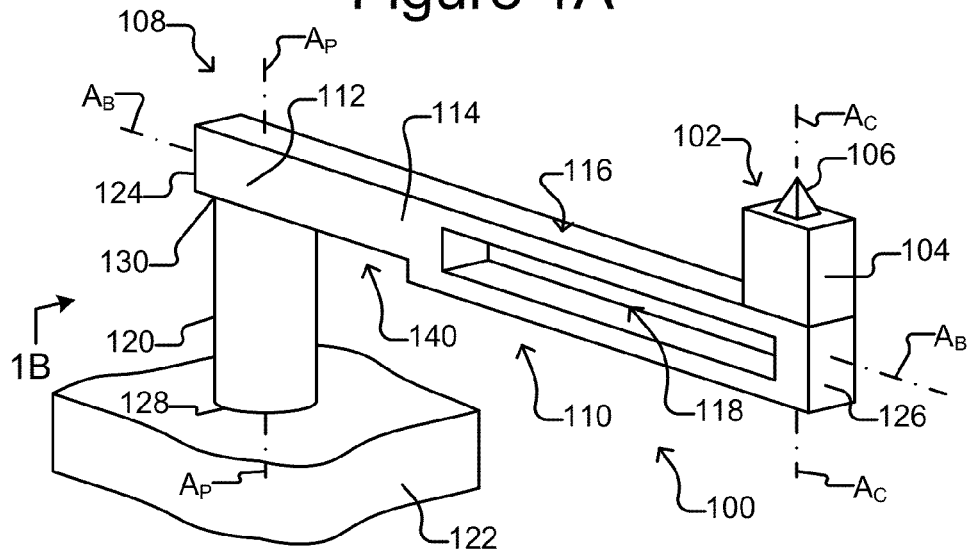
FIG. 1A illustrates a perspective view and FIG. 1B illustrates a side view of a probe having a beam structure with a cantilevered portion comprising a solid section and a hollow section according to some embodiments of the invention.
Figure 1B:
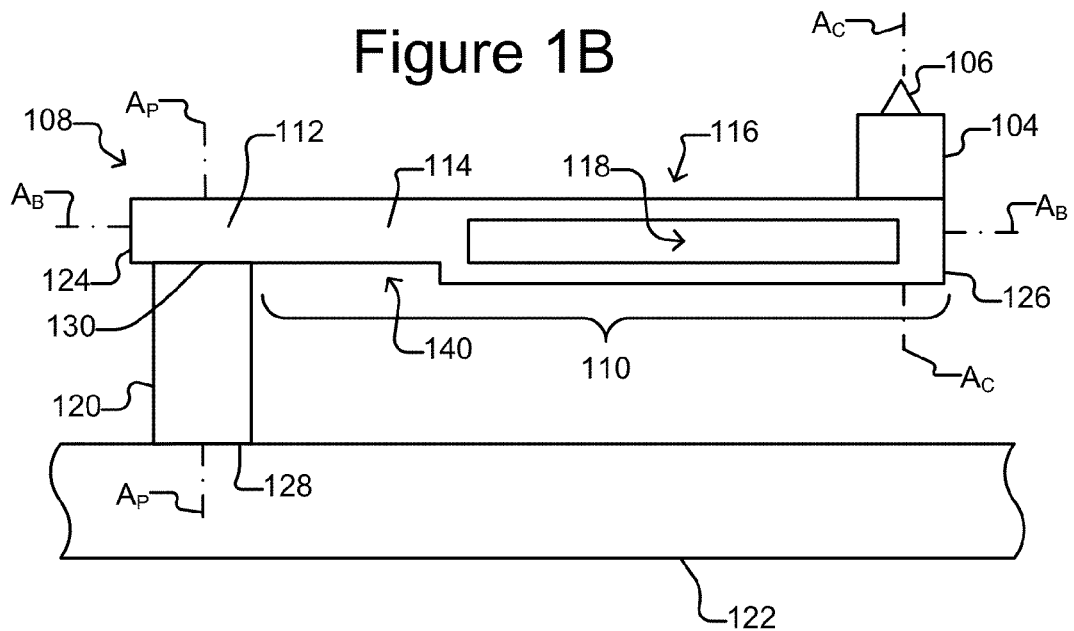

FIGS. 1A and 1B illustrate an electrically conductive probe 100 according to some embodiments of the invention. As shown, the probe 100 can include a post 120, a beam structure 108, and a contact structure 102 all of which can be electrically conductive. The probe 100 can thus be electrically conductive from a distal end 128 (e.g., a first end) of the post 120 to a tip 106 of the contact structure 102.

The post 120 can be attached (or can be configured to be attached) to a substrate 122, which can be a wiring substrate such as a printed circuit board or the like. For example, the distal end 128 of the post 120 can be attached to an electrically conductive terminal (not shown) of the substrate 122, to a surface of the substrate 122, or the like. The post 120 can be attached to the substrate 122 in any manner suitable for attaching such a post 120 to a substrate 122. For example, the post 120 can be soldered, adhered, pressure and/or heat bonded, or the like to the substrate 122. As yet another example, the post 120 can be fabricated on the substrate 122.

The post 120 can extend generally along an axis $A_P$ (e.g., a first axis) from the distal end 128 to a beam end 130 (e.g., a second end), which as will be discussed, can be attached to an attachment portion 112 of the beam structure 108. The post 120 can be any electrically conductive structure suitable for supporting the beam structure 108. For example, the post 120 can comprise a wire stem, a wire stem over coated with one or more materials, a bump, a stump, a deposit of conductive material, or the like.

Figure 2:
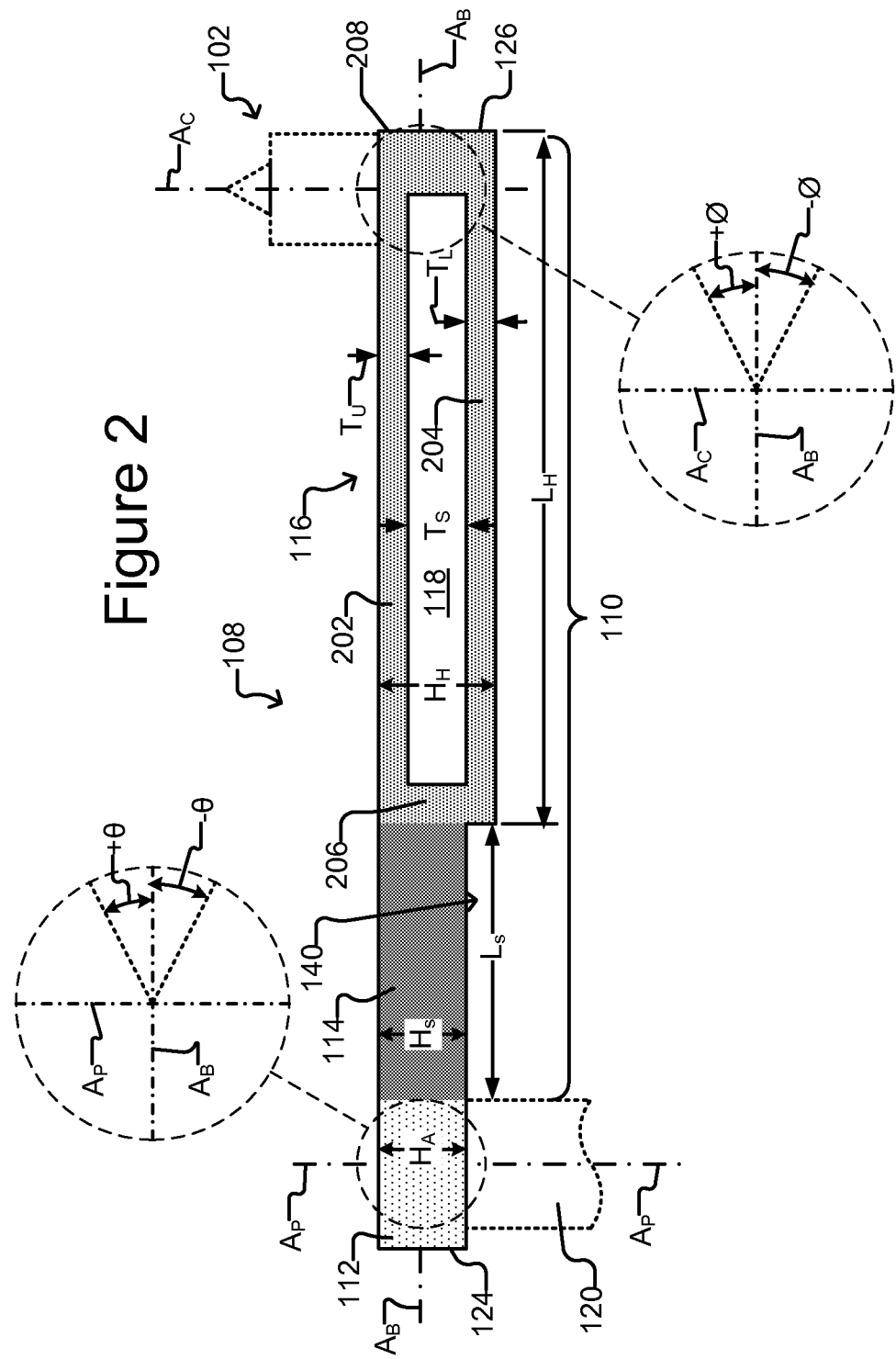
FIG. 2 illustrates a side view of the beam structure of FIGS. 1A and 1B with an attachment portion, a solid section, and a hollow section highlighted.

The beam structure 108 can be generally elongated along an axis $A_B$ (e.g., a second axis) that passes through a fixed end 124 and a free end 126. In some embodiments, the axis $A_B$ can be substantially perpendicular the axis $A_P$. (As used herein, "substantially" parallel, perpendicular, opposite, or the like means within fifteen degrees of parallel, perpendicular, opposite, or the like.) For example, the axis $A_B$ can be oriented to be within plus or minus an angle θ of perpendicular to the axis $A_P$ as illustrated in FIG. 2, where θ can be fifteen degrees. As shown in FIGS. 1A and 1B, the beam structure 108 can comprise an attachment portion 112, which can be attached to the beam end 130 of the post 120 as shown, and a cantilevered portion 110 that can extend as a cantilevered structure away from the attachment portion 112, which can be attached to the post 120 and extend as a cantilevered structure away from the post 120. In the illustrated example, the cantilevered portion 110 is not itself directly attached to the post 120 (and is thus "free") but can be a part of the beam structure 108 that is attached to the post 120 and extends away from the post 120 in a cantilevered fashion. The attachment portion 112 can be attached to the beam end 130 of the post 120 (or vice versa) in any manner suitable for attaching such a post 120 to a beam structure 108. For example, the post 120 and attachment portion 112 can be soldered, adhered, pressure and/or heat bonded, or the like to each other. As another example, the post 120 and attachment portion 112 can be formed as a monolithic structure and thus be portions of the same monolithic structure. As yet another example, the post 120 can be fabricated on the attachment portion 112, or the attachment portion 112 can be fabricated on the beam end 130 of the post 120.

The cantilevered portion 110 of the beam structure 108 can include a solid section 114 and a hollow section 116 having an interior, empty space 118. FIG. 2 shows the beam structure 108 with the attachment portion 112, the solid section 114, and the hollow section 116 with different shadings. As illustrated, the attachment portion 112 can be an end portion of the beam structure 108. As also shown, the hollow section 116 can include an enclosure surrounding the interior space 118. In the example shown in FIG. 2, the enclosure can include upper and lower enclosures 202 and 204 and left and right enclosures 206 and 208 that can form a contiguous enclosure enclosing the interior space 118. The solid section 114 can be a portion of the beam structure 108 between the attachment portion 112 and the hollow section 116. The contiguous enclosure enclosing the interior space 118 can be a box structure as shown or other shapes.

As shown in FIGS. 1A and 1B, the cantilevered portion 110 can include a notch 140, which can be in the solid section 114. For example, the notch 140 can comprise empty space below the solid section 114 (what could be thought of as a missing portion of the solid section 114) and adjacent the hollow section 116. As will be discussed, the notch 140 can affect one or more characteristics of the probe 100. In fact, as will be discussed, the notch 140 can be sized, shaped, and/or positioned to tailor one or more characteristics of the probe 100 as desired. The size, shape, and location of the notch 140 shown in FIGS. 1A and 1B is thus merely an example.

In FIG. 2, the length of the solid section 114 along the axis $A_B$ passing through the fixed end 124 and the free end 126 of the beam structure 108 is labeled $L_S$, and the length of the hollow section 116 along the axis $A_B$ is length $L_H$. The length $L_S$ of the solid section 114 can be a significant percentage of the overall length of the cantilevered portion 110 of the beam structure 108. Because the example shown in FIG. 2 includes one solid section 114 and one hollow section 116, the overall length of the cantilevered portion 110 in the example shown in FIG. 2 can be the sum of the length $L_S$ of the solid section 114 and the length $L_H$ of the hollow section 116. In other embodiments, however, there can be more than one solid section 114 and/or more than one hollow section 116. For example, the length $L_S$ of the solid section 114 can be at least five, ten, fifteen, twenty, thirty, forty, fifty, sixty, seventy, eighty, or more percentage of the overall length of the cantilevered portion 110. The length $L_H$ of the hollow section 116 can likewise be a significant percentage of the overall length of the cantilevered portion 110 of the beam structure 108. For example, the length $L_H$ of the hollow section 116 can be at least five, ten, fifteen, twenty, thirty, forty, fifty, sixty, seventy, eighty, or more percentage of the overall length of the cantilevered portion 110.

Moreover, the height $H_H$ of the hollow section 116 can be greater than the height $H_S$ of the solid section 114 as shown in FIG. 2. In such a case, the notch 140 in the solid section 114 can arise because of the difference in the heights $H_H$ and $H_S$ and can comprise the space under the solid section 114 between the hollow section 116 and the post 120 and/or the attachment section 112. As discussed above, however, the notch 140 can be different sizes and/or shapes and/or in different locations. For example, the notch 140 can be less than the entire length $L_S$ of the solid section 140. Moreover, some embodiments need not include the notch. Thus, for example, the height $H_H$ of the hollow section 116 can be equal to or less than the height $H_S$ of the solid section 114.

The height $H_S$ of the solid section 114 can be the same as the height $H_A$ of the attachment portion 112 as shown in FIG. 2, or alternatively, the height $H_S$ of the solid section 114 can be greater or less than the height $H_A$ of the attachment portion 112. Moreover, the thickness $T_U$ of the upper enclosure 202, the thickness $T_S$ of the space 118, and the thickness $T_L$ of the lower enclosure can the same or different than each other.

Referring again to FIGS. 1A and 1B, the contact structure 102 can include a tip 106 configured to contact and thereby form an electrical connection with a terminal of an electronic device (not shown in FIGS. 1A and 1B). In some embodiments, the contact structure 102 can include a base 104 that extends along an axis $A_C$ (e.g., a third axis) from the beam structure 108 at or proximate the free end 126 of the beam structure 108. In some embodiments, the axis $A_C$ can be substantially parallel (i.e., within fifteen degrees of parallel) to the axis $A_P$ and/or substantially perpendicular (i.e., within fifteen degrees of perpendicular) to the axis $A_B$. For example, the axis $A_B$ can be oriented to be within plus or minus an angle Ø of perpendicular to the axis $A_C$ as illustrated in FIG. 2, where Ø can be fifteen degrees. Regardless, the tip 106 can be disposed at a distal end of the base 104 as shown in FIGS. 1A and 1B. Alternatively, tip 106 can be disposed directly on the beam structure 108, and base 104 need not be included.

The tip 106 can be any electrically conductive structure suitable for contacting a terminal of an electronic device (not shown in FIGS. 1A and 1B). Although illustrated as a pyramid shape in FIGS. 1A and 1B, the tip 106 can be in other shapes including without limitation any of the following shapes: truncated pyramid, elongated blade or skate, bump, post, block, or the like. The base 104 can be any electrically conductive structure suitable for supporting the tip 106. For example, the base 104 can comprise a wire stem, a wire stem over coated with one or more materials, a bump, a stump, a deposit of conductive material, or the like. In some embodiments, the base 104 and tip 106 can be similar to the base 212 and tip 110 in U.S. Pat. No. 7,528,618, and base 104 and tip 106 can be made generally as disclosed in U.S. Pat. No. 7,528,618.

The base 104 (or the tip 106 if the base 104 is not included) can be attached to the beam structure 108 at or proximate the free end 126 of the beam structure 108. The base 104 can be attached to the beam structure 108 in any manner suitable for attaching such a base 104 to a beam structure 108. For example, the base can be soldered, adhered, pressure and/or heat bonded, or the like to the beam structure 108. As another example, the base 104 and the beam structure 108 can be formed as a monolithic structure and thus be portions of the same monolithic structure. As yet another example, the base 104 can be fabricated on the beam structure 108, or the beam structure 108 can be fabricated on the base 104. The tip 106 and the base 104 can be attached to each other using similar techniques.

Figure 3A:
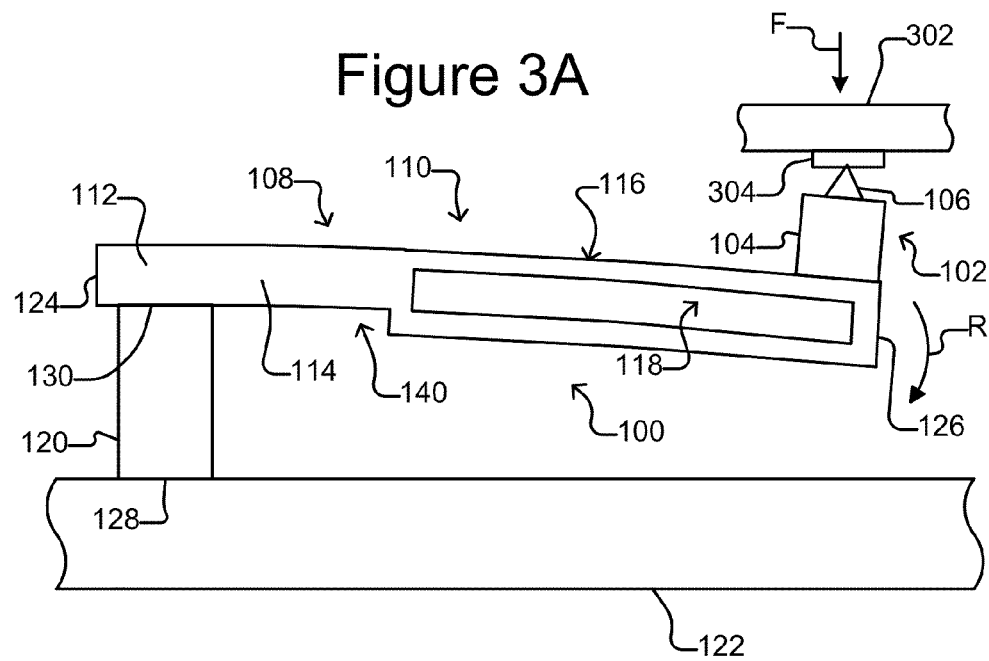
FIG. 3A shows the probe of FIGS. 1A and 1B in contact with a terminal of an electronic device, which is shown in partial view, according to some embodiments of the invention.

As illustrated in FIG. 3A, the cantilevered portion 110 of the beam structure 108 can bend in response to the force F of contact between the tip 106 and a terminal 304 of an electronic device 302. As shown, the force F can be substantially along parallel to the axis $A_C$. The fixed end 124 of the beam structure 108 (which can be part of or proximate to the attachment portion 112) can be fixed with respect to the post 120 due to the proximity of the fixed end 124 to the attachment portion 112. The free end 126 of the beam structure 108, however, can be free to move with respect to the post 120 (and attachment portion 112) as the cantilevered portion 110 bends in response to the force F. As shown in FIG. 3A, the free end 126 can rotate R generally with respect to the beam end 130 of the post 120 (and attachment portion 112) as the force F bends the cantilevered portion 110 of the beam structure 108.

Figure 3B:
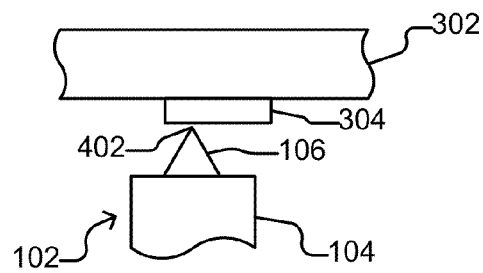
FIG. 3B illustrates first contact of the tip of the probe of FIGS. 1A and 1B at first contact with a terminal of an electronic device, which is shown in partial view, according to some embodiments of the invention.
Figure 3C:
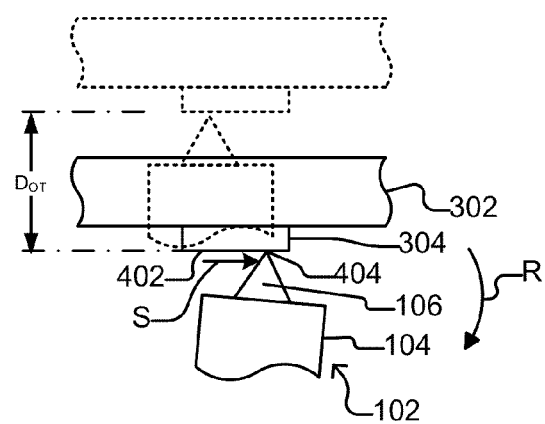
FIG. 3C shows the tip and terminal after movement past the first contact shown in FIG. 3B, illustrating a scrubbing motion of the tip on the terminal according to some embodiments of the invention.

As illustrated in FIGS. 3B and 3C, the rotation R of the free end 126 of the beam structure 108 can result in the tip 106 scrubbing (also known as wiping) across the terminal 304. For example, FIG. 3B illustrates first contact between tip 106 and terminal 304 at location 402 on terminal 304. As the electronic device 302 and/or the probe 100 moves past the first contact illustrated in FIG. 3B an over travel distance $D_{OT}$, the contact structure 102 can rotate R with respect to the post 120 (and attachment portion 112) and move across the terminal 304 to another location 404 as shown in FIG. 3C (which shows the location of the electronic device 302 and contact structure 102 at first contact in dashed lines). The resulting scrub (S) of the tip 106 across the terminal 304 can result in the tip 106 breaking through any oxide, debris, or other bather on the terminal 304.

In some embodiments, characteristics of the beam structure 108 can be selected to tailor the scrub (S).

For example, characteristics such as stiffness, length, size, shape, thickness of its parts, or the like of the hollow section 116 can be selected to obtain a scrub (S) of a desired length and/or a desired scrub ratio (a ratio the length of the scrub (S) to the over travel distance $D_{OT}$). For example, the length of scrub (S) and/or the aforementioned scrub ratio can be tailored by selecting desired values of the thickness $T_U$ of the upper enclosure 202, the thickness $T_S$ of the space 118, and the thickness $T_L$ of the lower enclosure shown in FIG. 2. For example, the greater the thickness $T_S$ compared to the thicknesses $T_U$ and $T_L$, the smaller the scrub ratio. For example, thicknesses $T_U$, $T_S$, and $T_L$ of about forty micrometers each can result in a scrub ratio of about twelve percent, while thicknesses $T_U$ and $T_L$ of about thirty-five micrometers each and a thickness $T_S$ of about fifty-five micrometers can result in a scrub ratio of about seven percent. (The foregoing numerical values are examples only and are in no way limiting.) Regardless of how accomplished, the length of the scrub (S) (or the scrub ratio) can be limited so that, for example, the scrub (S) does not result in the tip 106 moving off of the terminal 304. In some embodiments, the electronic device 302 can be one or more semiconductor dies, and the terminals 304 can be bond pads or the like of the semiconductor dies.

Figure 10:
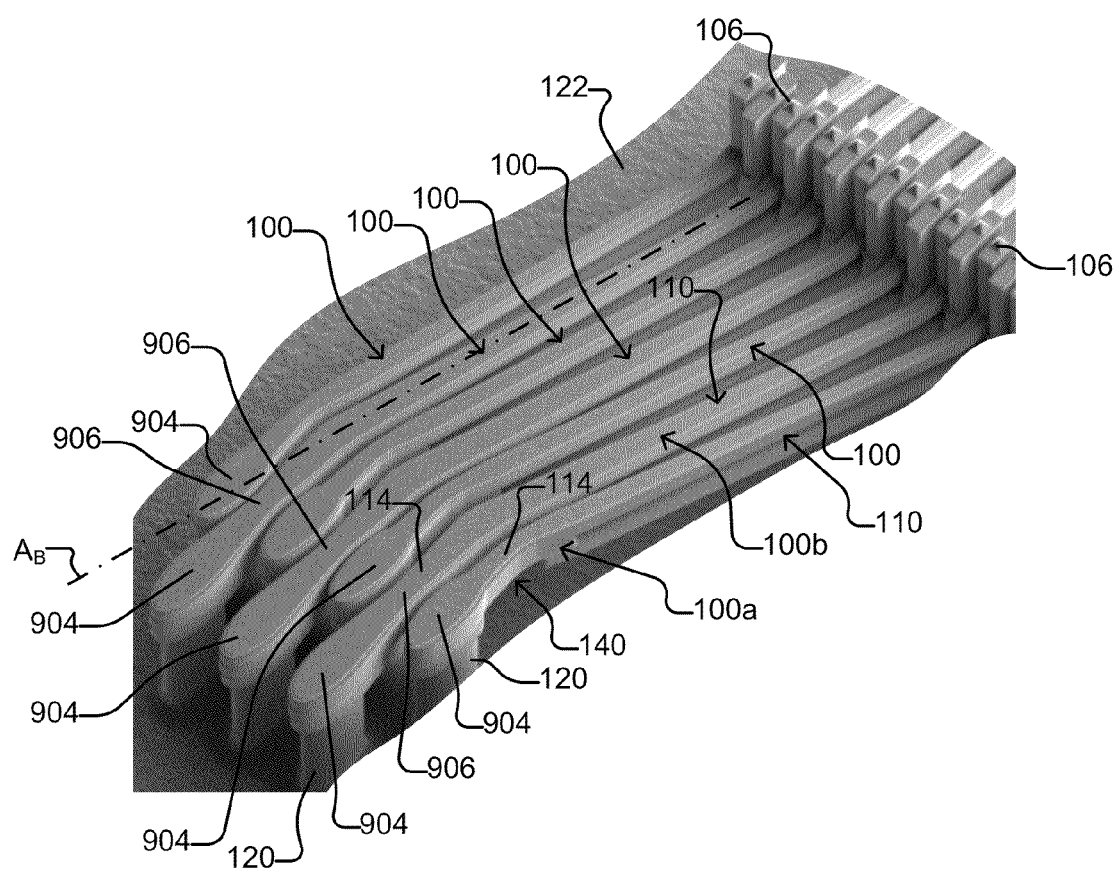
FIG. 10 illustrates an example of a plurality of such probes on a substrate according to some embodiments of the invention.

As another example, characteristics of the solid section 114 can be selected to obtain a desired scrub (S). For example, the size, shape, and/or location of the notch 140 in the solid section 114 can be selected to obtain a desired scrub (S) length and/or scrub (S) ratio. In fact, probes 100 that have cantilevered beam portions 110 of different lengths (e.g., as shown in FIG. 10) can be configured to have approximately equal scrub (S) lengths and/or scrub (S) ratios (e.g., as illustrated in FIGS. 3B and 3C) by including an appropriately sized, shaped, and/or located notch 140 in the solid section 114 of each probe 100. This will not necessarily be the case for probes that lack a notch 140 in their solid sections 110.

Figure 4:
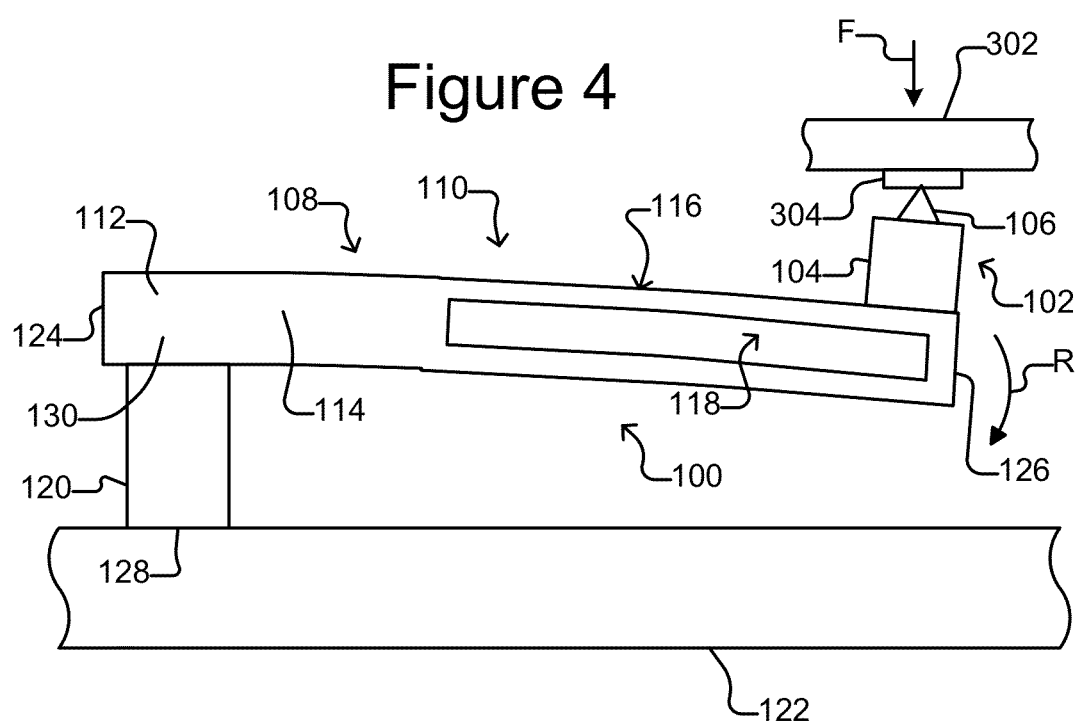
FIG. 4 illustrates a probe that lacks a notch in its solid section according to some embodiments of the invention.

For example, FIG. 4 illustrates the probe 100 with a solid section 114 that lacks a notch 140. Because of the lack of the notch in FIG. 4, the probe 100 of FIG. 4 will have different scrub (S) characteristics (e.g., scrub (S) length and/or scrub (S) ratio) than the probe 100 shown in FIG. 3A that includes a notch 140 in its solid section 110. Moreover, in a grouping of probes 100 that have cantilevered beam portions 110 of different lengths (e.g., as shown in FIG. 10) but that lack the notches 140 in their solid sections 114, it can be difficult to configured the probes 100 to have approximately equal scrub (S) lengths and/or scrub (S) ratios (e.g., as illustrated in FIGS. 3B and 3C).

The probe 100 illustrated in FIGS. 1A, 1B, and 2 is an example only, and variations are contemplated. For example, the sizes and shapes of the elements of the probe 100 illustrated in FIGS. 1A, 1B, and 2 are examples only. Thus, for example, the post 120 can be a different size and a shape other than a cylinder. For example, post 120 can be in the shape of an oval cylinder, a rectangular or square block, or the like. As another example, base 104 (if included) can be other sizes and shapes as can tip 106. As yet another example, the beam structure 108, including one or more of the attachment portion 112, the solid section 114, and/or the hollow section 116, can be other sizes and shapes. The interior space 118 can thus also be different sizes and shapes. As discussed above, the heights $H_A$, $H_S$, and $H_H$ and the lengths $L_S$ and $L_H$ shown in FIG. 2 can also be different than shown.

Other examples of variations of the beam structure 108 include features of beams 32 disclosed in U.S. Pat. No. 7,782,072. For example, the cantilevered portion 110 of the beam structure 108 can be curved and/or have a tapered width similar to beams 32 in U.S. Pat. No. 7,782,072. As another example, the attachment portion 112 of the beam structure 108 can be or comprise a generally circular or oval shaped beam end similar to the mounting portion 38 of the beams 32 U.S. Pat. No. 7,782,072, which is incorporated herein in its entirety by reference. As yet another example, part of the attachment portion 112, the solid section 114, and/or the hollow section 116 of the beam structure 108 can include a narrowing region like the narrowing region 34 in U.S. Pat. No. 7,782,072, which can facilitate posts 120 of adjacent probes 100 to be disposed in staggered rows and spaced apart at a smaller pitch than the size of the posts 120 would otherwise allow as illustrated, for example, in FIGS. 4 and 5 of U.S. Pat. No. 7,782,072. Examples are illustrated in and discussed below with respect to FIGS. 9 and 10.

Figure 5A:
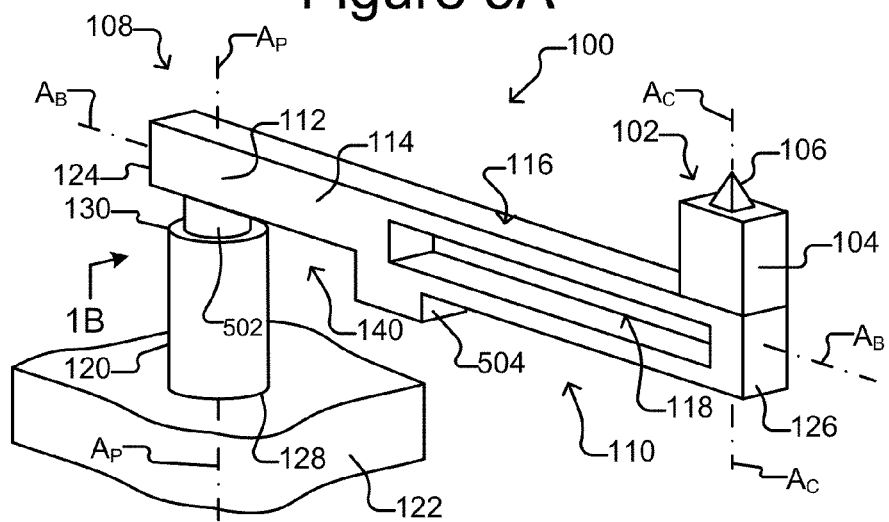
FIG. 5A illustrates a perspective view and FIG. 5B illustrated a side view of a probe with examples of variations of the probe of FIGS. 1A and 1B; the illustrated probe includes a patch structure that strengthens an expected high stress portion of the beam structure and a standoff that is part of the attachment portion of the beam structure according to some embodiments of the invention.
Figure 5B:
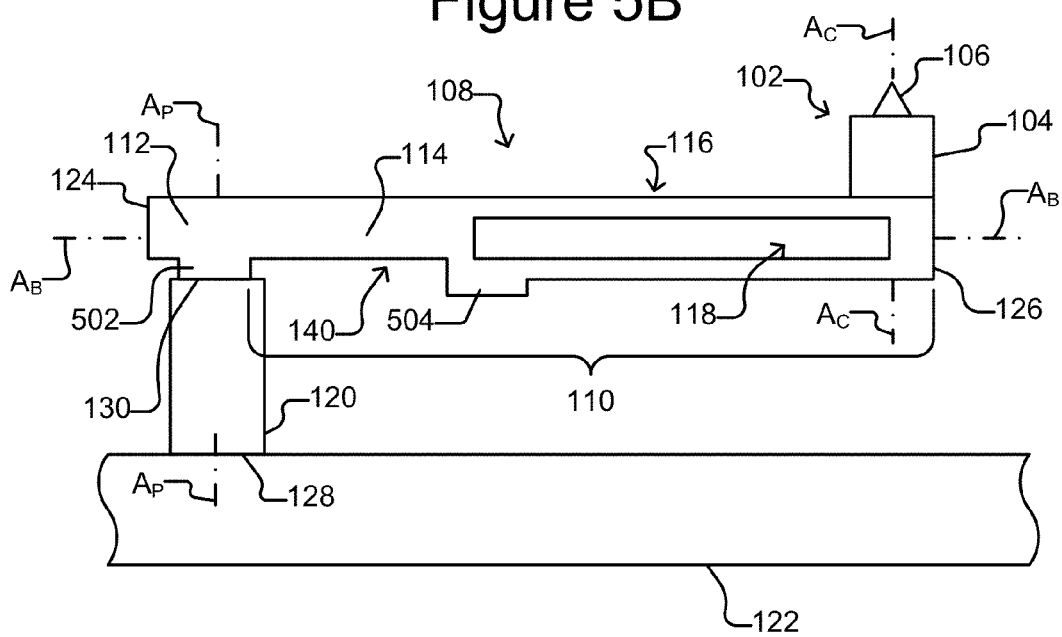

FIGS. 5A and 5B illustrate additional examples of variations of the probe 100 shown in FIGS. 1A, 1B, and 2. The embodiment illustrated in FIGS. 5A and 5B can include a patch structure 504 for strengthening the beam structure 108 at a location of expected relative higher stress. The patch structure 504 can be extra material that thickens, makes bigger, or otherwise reduces. The patch structure 504 can be located anywhere lower stress is desired. The patch structure 504 in FIGS. 5A and 5B is located proximate one of the corners of the space 118 of the hollow section 116. The patch structure 504 can alternatively be in other locations on the hollow section 116 and/or the solid section 114. Moreover, although one patch structure 504 is shown in FIGS. 5A and 5B, there can alternatively be more than one patch structure 504 on the beam structure 108. The presence of the patch structure 504 can allow for a shorter length of the cantilevered portion 110 of the beam structure 108, a tighter pitch between tips 106 of adjacent probes 100 attached to the same substrate 100, and/or tolerance of a greater over travel distance $D_{OT}$ (see FIG. 3C).

As also shown in FIGS. 5A and 5B, the embodiment illustrated in FIGS. 5A and 5B can include a standoff 502, which can be part of the attachment portion 112 of the beam structure 108. The standoff 502 can be attached directly to the post 120. As shown, the notch 140 can be between the patch structure 504 and the standoff 502.

Figure 6A:
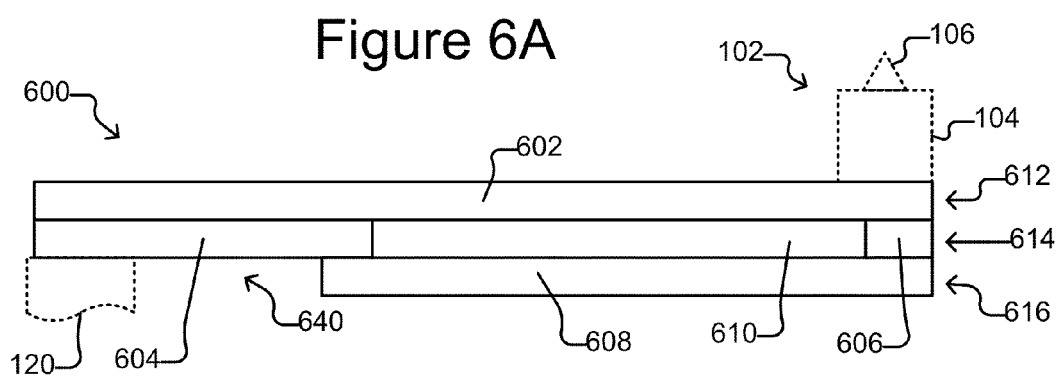
FIG. 6A illustrates an example in which the beam structure of the probe of FIGS. 1A and 1B comprises various structures disposed in a stack of substantially parallel layers according to some embodiments of the invention.
Figure 6B:
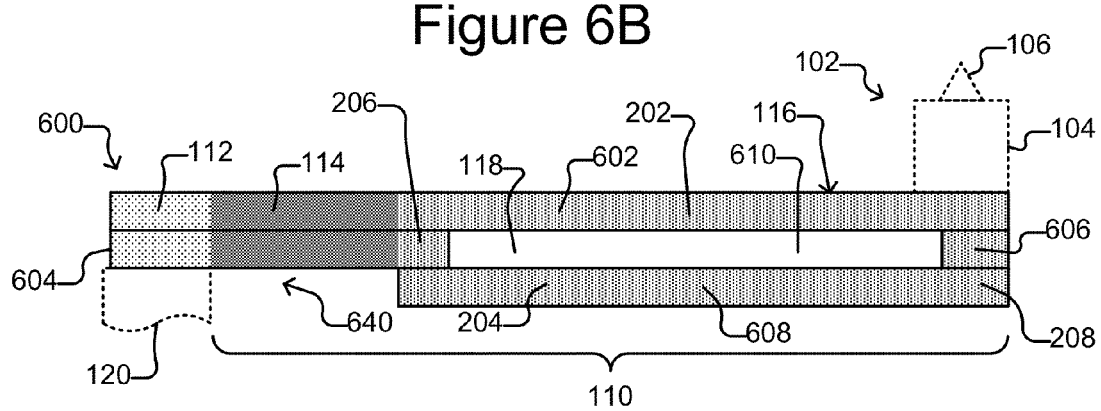
FIG. 6B shows the beam structure of FIG. 6A with the attachment portion, the solid section, the hollow section highlighted with different shadings.

Other possible variations of the probe 100 illustrated in FIGS. 1A-5B include whether the probe 100 or its parts are monolithic or comprise attached pieces. For example, the post 120 can be a monolithic structure as generally illustrated in the drawings or can comprise structurally distinct parts, and the contact tip 102 can similarly comprise distinct parts as shown in the drawings (e.g., the tip 106 and base 104) or can be a monolithic structure. The beam structure 108 in FIGS. 1A, 1B, 2, 5A, and 5B can likewise be a monolithic structure as illustrated in those figures or can comprise distinct parts. FIGS. 6A and 6B illustrate an example in which the beam structure 108 of FIGS. 1A, 1B, and 2 comprises distinct parts, and FIGS. 7A and 7B illustrate an example in which the beam structure 108 of FIGS. 5A and 5B also comprises distinct parts.

In the example shown in FIG. 6A, the beam structure 108 of FIGS. 1A, 2A, and 2 (which is labeled 600 in FIG. 6A) can comprise multiple structural elements disposed in a stack of substantially parallel layers 612, 614, and 616 (although three layers are shown, there can be more or fewer). As shown in FIG. 6A, a first beam component 602 can be disposed in a first layer 612. A second layer 614 can include a first spacer 604 and a second spacer 606 attached (e.g., using any of the attachment techniques discussed above for attaching the base 104 to the beam structure 108) to the first beam component 602 with an empty space 610 between the first spacer 604 and the second spacer 606. A third layer 616 can include a second beam component 608, which can be attached (e.g., using any of the attachment techniques discussed above for attaching the base 104 to the beam structure 108) to the first spacer 604 and the second spacer 606 with the empty space 610 between the first beam component 602 and the second beam component 608. An empty space 640 in the third layer 616 adjacent the second beam component 608 can correspond to the notch 140 in FIGS. 1A-3A. The resulting structure can be the beam structure 600, which is an example of a configuration of the beam structure 108 and can thus replace beam structure 108 in FIGS. 1A-3C.

FIG. 6B illustrates the resulting beam structure 600 with the attachment portion 112, the solid section 114, and the hollow section 116 highlighted with different shadings. As can be seen in FIG. 6B, an elongated end portion of the first beam component 602, an end portion of the first spacer 604, the second spacer 606, and the second beam component 608 can correspond to the hollow section 116. (Compare to FIGS. 1A, 1B, and 2.) For example, an elongated end portion of the first beam component 602 can correspond to the upper enclosure 202 in FIG. 2, the second beam component 608 can correspond to the lower enclosure 204, an end portion of the first spacer 604 can correspond to the left enclosure 206, and the second spacer 606 can correspond to the right enclosure 208. The empty space 610 can correspond to the empty space 118 in FIGS. 1A, 1B, and 2. As can also be seen in FIG. 6B, end portions of the first beam component 602 and the first spacer 604 can correspond to the solid portion 114 in FIGS. 1A, 1B, and 2, and interior portions of the first beam component 602 and the first spacer 604 can correspond to the attachment portion 112 in FIGS. 1A, 1B, and 2.

Figure 7A:
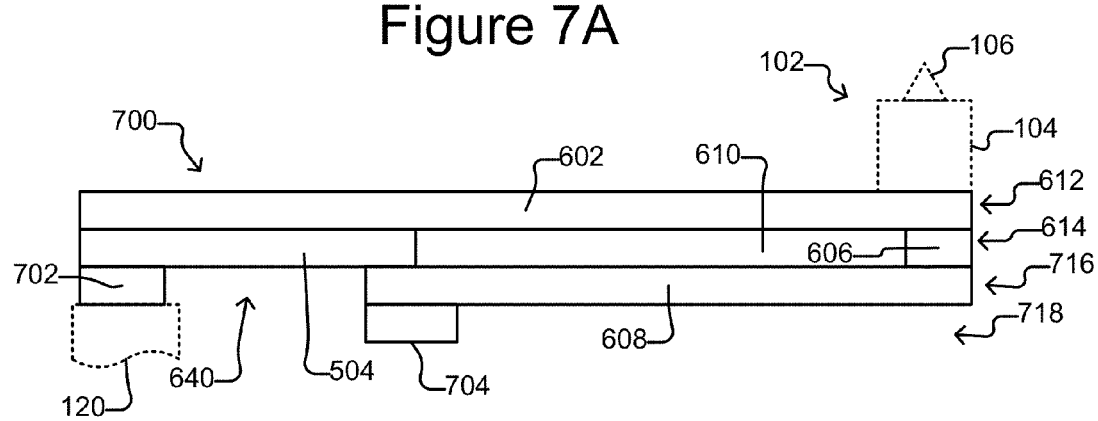
FIG. 7A illustrates an example in which the beam structure of the probe of FIGS. 5A and 5B comprises various structures disposed in a stack of substantially parallel layers according to some embodiments of the invention.
Figure 7B:
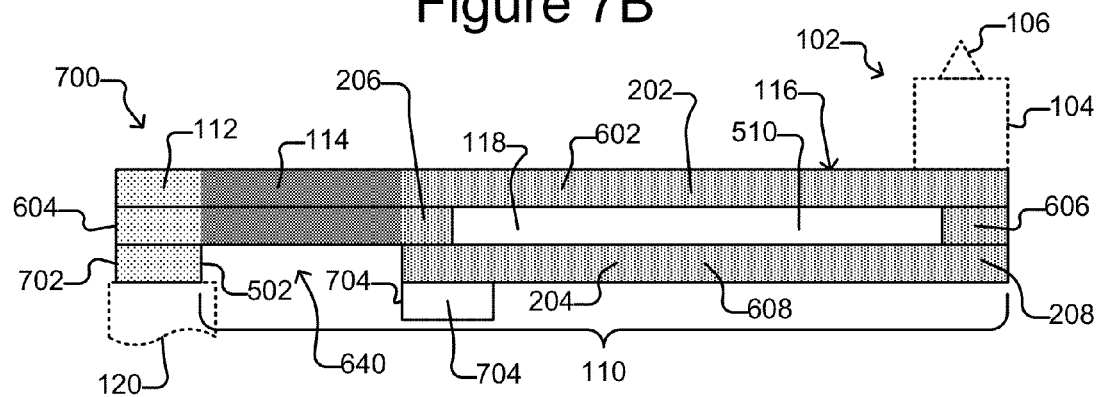
FIG. 7B shows the beam structure of FIG. 7A with the attachment portion, the solid section, and the hollow section highlighted with different shadings.

The example of a beam structure 108 shown in FIG. 7A is similar to FIG. 6A but further includes a standoff 702 in the third layer 716, and a fourth layer 718 in which a patch structure 704 is disposed and attached to the second beam component 508. As shown, empty space 640 between the second beam component 608 and the standoff 702 can comprise the notch 140 in FIGS. 1A-3A. FIG. 7B illustrates the resulting beam structure 700 (which is an example of a configuration of the beam structure 108 in FIGS. 5A and 5B and can thus replace beam structure 108 in FIGS. 5A and 5B) with the attachment portion 112, the solid section 114, and the hollow section 116 highlighted with different shadings. FIG.

7B is similar to FIG. 6B except that the attachment section 112 further includes the standoff 702 (which can correspond to the standoff 502 in FIGS. 5A and 5B) and the patch structure 704 (which can correspond to the patch structure 504 in FIGS. 5A and 5B) is present in FIG. 7B.

The probe 100 or any part of the probe 100 (e.g., the post 120, the beam structure 108, and/or the contact structure 102), including any variation of the probe 100 illustrated in the drawings and/or discussed in herein, can be made in any suitable manner for making such probes 100. For example, the probe 100 or any part of the probe 100 (e.g., the beam structure 108) can be stamped or cut out of one or more pieces (e.g., a sheet) of material (e.g., metal). As another example, the probe 100 or any part of the probe 100 (e.g., the beam structure 108) can be forged or molded. As yet another example, the post 120, the beam structure 108, and/or the contact structure 102 (or any portions of the foregoing) can be fabricated using lithographic techniques. For example, the post 120, the beam structure 108, and/or the contact structure 102 (or any portions of the foregoing) can be fabricated by depositing electrically conductive material into an opening in a sacrificial material (e.g., photo resist) generally like spring contacts 220 are fabricated by depositing material into openings 210 in the sacrificial material 208 as shown in FIGS. 3A and 3B in U.S. Pat. No. 7,047,638.

The examples of beam structures 108 and 108' illustrated in FIGS. 6A, 6B, 7A, and 7B can also be made in a variety of ways. For example, the first beam component 602, the first spacer 604, the second spacer 606, the second beam component 608, the standoff 702, and/or the patch structure 704 can be stamped or cut out of one or more pieces (e.g., a sheet) of material (e.g., metal), forged, molded, or the like and then attached to each other as shown in FIGS. 6A and 7A and discussed above. As another example, the first beam component 602, the first spacer 604, the second spacer 606, the second beam component 608, the standoff 702, and/or the patch structure 704 can be fabricated in successive layers of a lithographically patterned material. For example, the first beam component 602 can be fabricating by depositing material like material 155 in FIGS. 13c and 13d of U.S. Pat. No. 6,672,875 into an opening like opening 151 in a first layer of masking material (e.g., photo resist) like layer of masking material 150 in FIG. 13b of U.S. Pat. No. 6,672,875. The first spacer 604 and the second spacer 606 can then be similarly formed by depositing material into similar openings in a second masking on the first layer of masking material and the first beam component 602. The second beam 606 can then be similarly formed by depositing material into a similar opening in a third masking on the second layer of masking material, the first spacer 604, and the second spacer 606. The standoff 702 can similarly be formed in an opening in the third layer of masking material, and the patch structure 704 can be formed in an opening in a fourth layer of masking material. All of the layers of masking materials can be discarded, leaving the first beam component 602, the first spacer 604, the second spacer 606, the second beam component 608, the standoff 702, and/or the patch structure 704. The post 120, the base 104, and/or the tip 106 can similarly be formed in openings in layers of such masking materials. All of the foregoing can be performed generally in accordance with the teachings of U.S. Pat. No. 6,672,875 and/or U.S. Pat. No. 6,268,015.

Figure 8:
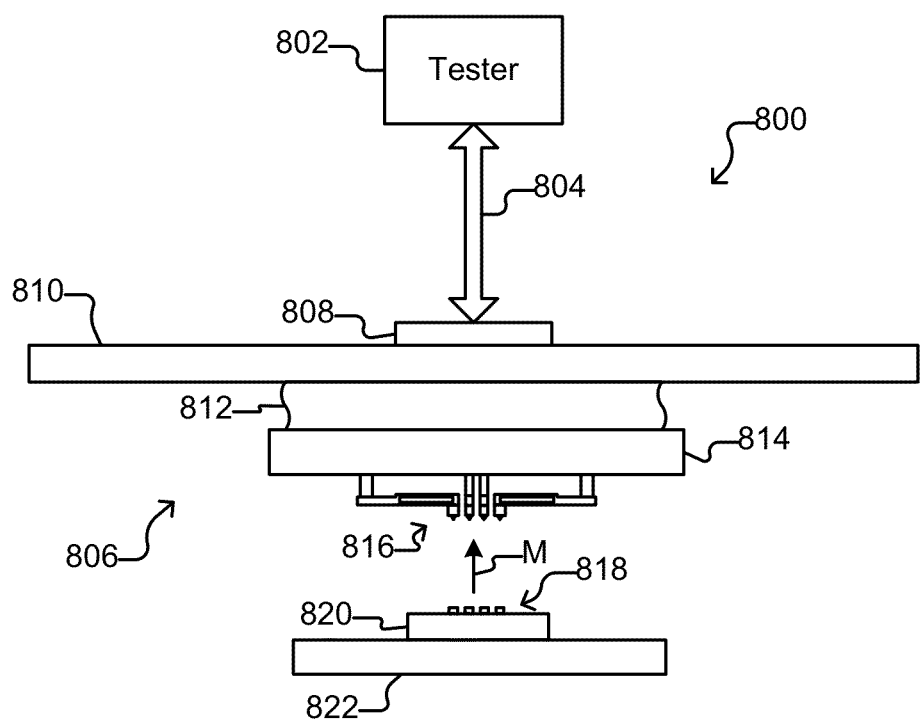
FIG. 8 is a block diagram of a test system in which the probes disclosed herein can be used according to some embodiments of the invention.

There are many possible uses and applications for the probe 100 including any variation described herein (e.g., the probe 100 illustrated in FIGS. 1A, 1B, and 2; the probe 100 illustrated in FIGS. 5A and 5B; the probe 100 illustrated in FIGS. 1A, 1B, and 2 implemented with the beam structure 600 of FIG. 6A; and/or the probe 100 illustrated in FIGS. 5A and 5B implemented with the beam structure 700 of FIG. 7A). For example, probes like probe 100 can be used to make electrical connections with an electronic device. FIG. 8 illustrates an example of a test system 800 for testing an electronic device 820 in which electrically conductive probes 816 can be brought into contact with terminals 818 of the electronic device 820 to test the electronic device 820 according to some embodiments of the invention. Each of the probes 816 can be the probe 100 including any of the above-referenced variations thereof. Thus, the probe 100, including any of the above-referenced variations thereof, can replace each of the probes 816 in FIG. 8.

As shown, the test system 800 can include a tester 802, communications channels 804, a test contactor 806, and a stage 822. The tester 802 can comprise a computer, a computer system, or other electronic control equipment, and can be configured to control testing of the electronic device 820. The communications channels 804 can comprise electrical connections (e.g., cables, wires, wireless channels, or the like) for conveying electrical signals, power, and the like from and to the tester 802.

The test contactor 806 (e.g., a probe card assembly or the like) can comprise an electrical interface 808 (e.g., zero-force-insertion electrical connectors, pogo-pin pads, or the like) that connects to the communications channels 804 on a wiring substrate 810 (e.g., a printed circuit board or the like) and a probe substrate 814 (e.g., a printed circuit board, ceramic wiring substrate, or the like) with probes 816 attached thereto. As discussed above, each probe 816 can be a probe 100 illustrated in FIG. 1A, 1B, 2, 5A, or 5A including any variation therefore illustrated or discussed herein (e.g., with the beam structure 600 or 700 illustrated in FIG. 6A or FIG. 7A). A connector 812 (e.g., an interposer, flexible electrical connections, solder, or the like) can connect the wiring substrate 810 and the probe substrate 814 such that each probe 816 is electrically connected to the interface 808. For example, the wiring substrate 810, the connector 812, and the probe substrate 814 can include electrical connections (not shown) between the interface 808 and the probes 816.

The test contactor 806 can be fastened together and mounted as a unit to a housing (not shown) such as the housing of a test prober (not shown). The stage 822 can be located in such a housing (not shown). The stage 822 and/or the test contactor 806 can be moveable to align ones (more than one) of the probes 816 with ones of the terminals 818 and then bring the ones of the probes 816 into contact with the ones (more than one) of the terminals 818 and thereby electrically connect the probes 816—and thus the tester 802—to the electronic device 820. The tester 802 can provide test signals, power, and/or the like through the communications channels 804 and test contactor 806 (including the probes 816) to the terminals 818 of the electronic device 820. Response signals generated by electronic device 820 and output through terminals 818 can be sensed by the probes 816 and provided through the test contactor 806 and communications channels 804 to the tester 802. The tester 802 can analyze the response signals to determine whether electronic device 820 responded properly to the test signals and, consequently, whether electronic device 820 passes or fails the testing. The tester 802 can alternatively or in addition perform tasks other than testing the electronic device 820. For example, the tester 802 can operate the electronic device 820, for example, to burn in the electronic device.

The electronic device 820 can be any electronic device or devices to be tested, including without limitation one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices. As mentioned, in some embodiments, the electronic device 820 can be one or more semiconductor dies, and the probes 816 (and thus probe 100 including any disclosed variation thereof) can be sized to contact terminals (e.g., bond pads) of semiconductor dies.

The test system 800 illustrated in FIG. 8 is an example only, and variations are contemplated. For example, the test contactor 806 can include additional elements not shown in FIG. 8. As another example, the test contactor 806 need not include all of the elements shown in FIG. 8. For example, connector 812 need not be included, and the probe substrate 814 can be connected directly to the wiring substrate 810. As another example, some or all of the tester 802 can be disposed on the test contactor 806 (e.g., on the wiring substrate 810 and/or probe substrate 814).

Figure 9:
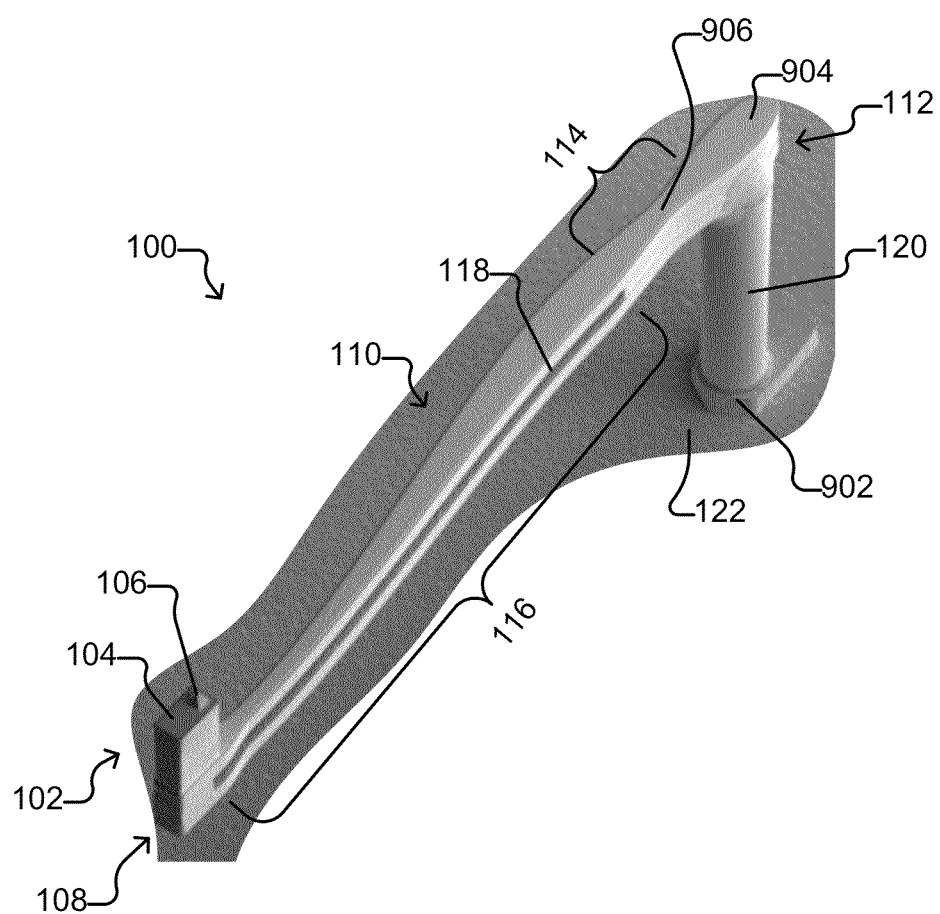
FIG. 9 illustrates an example of a probe.

FIG. 9 shows an example of a probe 100, which can be configured, for example, like probe 600 or 700. A contact structure 102 comprising a base 104 and tip 106 are shown, all of which can be as described above. A beam structure 108 comprising a cantilevered portion 110 and attachment portion 112 is also illustrated, which can also be as described above. The cantilevered portion 110 is illustrated as comprising a solid section 114 and a hollow section 116 with an interior (empty) space 118, all of which can be as described above. In FIG. 9, the substrate 122 is shown comprising an electrically conductive terminal 902 to which the post 120 can be attached.

In FIG. 9, the attachment portion 112 is shown comprising an oval shaped beam end 904, which as discussed above, can be the same as or similar to the mounting portion 38 of the beams 32 in U.S. Pat. No. 7,782,072. In FIG. 9, the solid section 114 is illustrated comprising a narrowing region 906, which as also discussed above, can be like the narrowing region 34 of the beams 32 in U.S. Pat. No. 7,782,072.

FIG. 10 shows a plurality of probes 100 (which can be configured, for example, like probes 600 or 700) disposed on a substrate 122. As shown, narrowing regions 906 can correspond to beam ends 904 of adjacent probes 100, which can be generally as disclosed in U.S. Pat. No. 7,782,072. This with the standoff 502 or 702 (not visible in FIGS. 9 and 10) can facilitate locating adjacent probes 100 close together.

As also shown in FIG. 10, the cantilevered beam portions 110 of the probes 100 can have different lengths. For example, the cantilevered beam portion 110 of probe 100a is shorter than the cantilevered beam portion 110 of probe 100b in the example of FIG. 10. Notches 140 in the probes 100a and 100b, however, can be configured to cause probes 100a and 100b to have approximately the same scrub (S) length and/or scrub (S) ratio generally as discussed above. In fact, notches 140 in all of the probes 100 in FIG. 10 can be configured to cause all of the probes 100 to have approximately the same scrub (S) length and/or scrub (S) ratio despite the fact that the cantilevered beam portions 110 of the probes 100 are not the same length. Absent the notches 140 in each probe 100, it could be difficult to configure probes 100 with cantilevered beam portions 110 of different lengths, such as illustrated in FIG. 10, to have approximately the same scrub (S) length and/or scrub (S) ratio.

Figure 11:
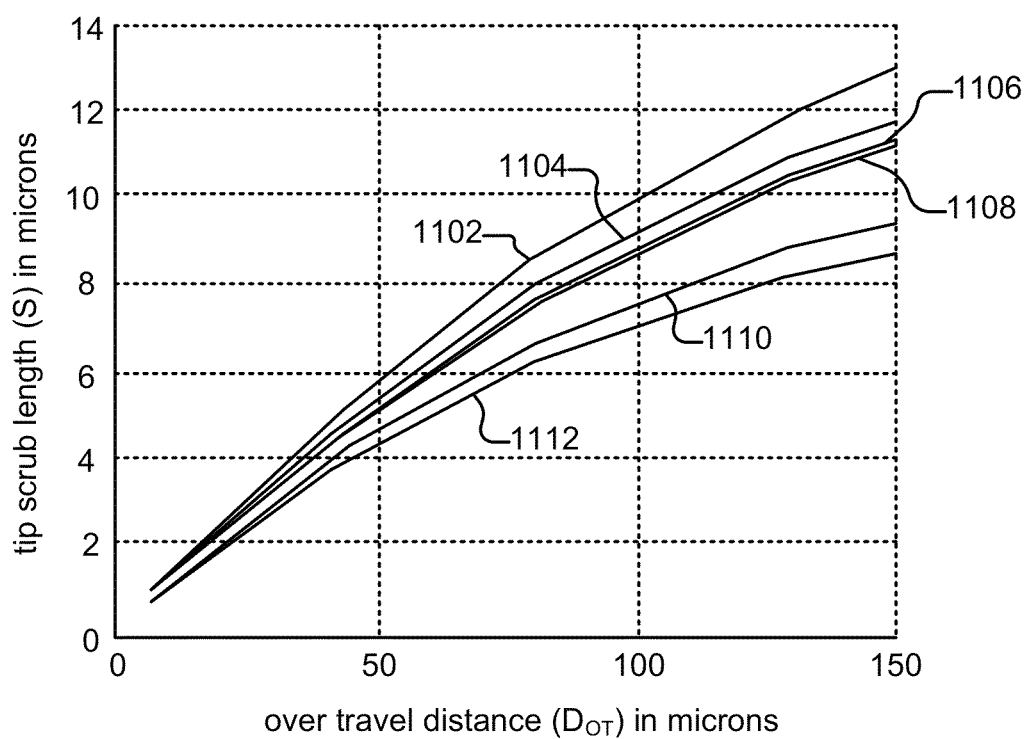
FIG. 11 illustrates examples of tip scrub for probes without notches.
Figure 12:
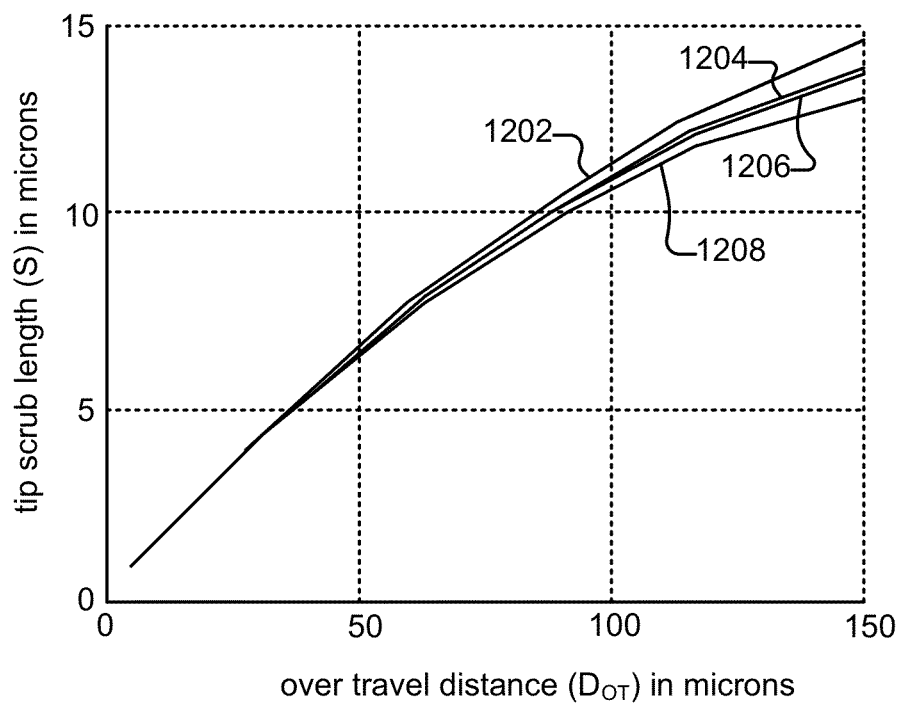
FIG. 12 illustrates examples of tip scrub for probes with notches according to some embodiments of the invention.

FIGS. 11 and 12 illustrate examples of the foregoing. In both FIGS. 11 and 12, the horizontal axes represent the over travel distance illustrated as $D_{OT}$ in FIGS. 3B and 3C in microns by which a terminal 304 of a DUT is moved past first contact with the tip 106. (See FIGS. 3B and 3C.) The vertical axes in FIGS. 11 and 12 represent the length of the resulting scrub (S) of the tip 106 across the terminal 304 as illustrated in FIG. 3C. Curves 1102, 1104, 1106, 1108, 1110, and 1112 in FIG. 11 are for probes 100 having different beam lengths and no notch 140. In contrast, curves 1202, 1204, 1206, and 1208 in FIG. 12 are for probes 100 that also have different beam lengths but have notches 140. As can be seen, there is less variation in the scrub (S) length of the tips 106 of different length probes 100 with notches 140 (FIG. 12) than different length probes 100 that lack notches 140 (FIG. 11).

More specifically, in FIG. 11, the curves 1102, 1104, and 1106 correspond to probes with long cantilevered beam portions 110, and curves 1108, 1110, and 1112 correspond to probes with short cantilevered beam portions 110. (As used herein, the term "long" means longer than the cantilevered beam portion 110 of the probes 100 corresponding to curves 1108, 1110, and 1112, and the term "short" means shorter than the cantilevered beam portion 110 of the probes 100 corresponding to curves 1102, 1104, and 1106.) The probes 100 corresponding to curves 1102 and 1108 have curved cantilevered beam portions 110 such that their tips 106 are offset from their respective posts 120 by about four-hundred microns. The probes 100 corresponding to curves 1104 and 1110 also have curved cantilevered beam portions 110 but their tips 106 are offset from their respective posts 120 by about two-hundred microns. The probes 100 corresponding to curves 1106 and 1112 have straight cantilevered beam portions 110 such that their tips 106 are not offset from their respective posts 120. (As noted above, the cantilevered beam portion 110 of each probe 100 can be straight along an axis $A_B$ as illustrated in, for example, FIG. 1A, or alternatively, the cantilevered beam portion 110 can be curved as illustrated in, for example, FIG. 10 in which the post 120 of the probe 100 is on the axis $A_B$ but the tip 106 of the probe 100 is offset from the axis $A_B$.)

In FIG. 12, the curves 1202 and 1204 correspond to notched probes 100 with long cantilevered beam portions 110, and curves 1206 and 1208 correspond to notched probes 110 with short cantilevered beam portions 110. The notched probes 100 corresponding to curves 1202 and 1206 have curved cantilevered beam portions 110 such that their tips 106 are offset from their respective posts 120. The notched probes 100 corresponding to curves 1204 and 1208 have straight cantilevered beam portions 100.

Although specific embodiments and applications of the invention have been described in this specification, these embodiments and applications are exemplary only, and many variations are possible.

We claim:

1. An electrical probe comprising:

an electrically conductive post disposed on a first axis passing through a first end and a second end of said post;

an electrically conductive beam structure comprising an attachment portion attached directly to said second end of said post and a free cantilevered portion extending directly away from said attachment portion along a second axis that is substantially perpendicular to said first axis, wherein:

said cantilevered portion of said beam comprises a solid section and a hollow section, a length of said solid section is at least fifteen percent of a length of said cantilevered portion, a length of said hollow section is at least fifteen percent of said length of said cantilevered portion, and said solid section is disposed between said attachment portion and said hollow section.

2. The electrical probe of claim 1, wherein said cantilevered portion comprises a notch in said solid section adjacent said hollow section.

3. The electrical probe of claim 1, wherein said hollow section comprises a box structure.

4. The electrical probe of claim 1, wherein said hollow section comprises a contiguous enclosure enclosing an interior space.

5. The electrical probe of claim 4, wherein said beam structure comprises stacked layers each substantially parallel to said second axis, wherein:
a first of said layers comprises a first beam component extending a length of said beam structure from said free end of said beam structure to an opposite end of said beam structure;
a second of said layers comprises a first spacer attached to said first beam component, a second spacer attached to said first beam component, and an empty space between said first spacer and said second spacer; and
a third of said layers comprises a second beam component attached to said first spacer and said second spacer, said empty space being between said first beam component and said second beam component.

6. The electrical probe of claim 5, wherein:
said attachment portion comprises first end portions of said first beam component and said first spacer;
said solid section comprises interior portions of said first beam component and said first spacer; and
said contiguous enclosure of said hollow section comprises an elongated end portion of said first beam component, a second end portion of said first spacer, said second spacer, and said second beam component.

7. The electrical probe of claim 6, wherein:
said third layer further comprises a standoff attached to said first end portion of said first spacer; and
said attachment portion further comprises said standoff.

8. The electrical probe of claim 7, wherein said cantilevered portion comprises a notch in said solid section, said notch comprising an empty space between said standoff and said second beam component.

9. The electrical probe of claim 7, wherein said second end of said post is directly attached to said standoff.

10. The electrical probe of claim 5, wherein a fourth of said layers comprises a patch structure attached at least in part to an end of said second beam component that is attached to said first spacer.

11. The electrical probe of claim 1 further comprising an electrically conductive contact structure attached to and extending from a free end of said beam structure,
wherein:
said post extends in a first direction along said first axis from a first side of said beam structure,
said contact structure extends in a second direction along a third axis from a second side of said beam structure, said third axis being substantially parallel to said first axis, and
said first direction is substantially opposite said second direction.

12. The electrical probe of claim 11, wherein:
said cantilevered portion is free to move in response to a force of contact of a terminal of an electronic device with said contact structure such that said free end rotates with respect to said attachment portion of said beam structure, and
said cantilevered portion is resilient.

13. The electrical probe of claim 1 further comprising an electrically conductive contact structure attached to and extending from a free end of said beam structure, wherein said probe is sized for said contact structure to contact a bond pad of a semiconductor die.

14. A test contactor comprising:
an electrical interface to a tester configured to control testing of an electronic device;
a substrate; and
electrically conductive probes each comprising:
an electrically conductive post disposed on a first axis passing through a first end and a second end of said post, said first end being attached to said substrate and electrically connected to said electrical interface;
an electrically conductive beam structure comprising an attachment portion attached directly to said second end of said post and a free cantilevered portion extending directly away from said attachment portion along a second axis that is substantially perpendicular to said first axis,
wherein:
said cantilevered portion of said beam comprises a solid section and a hollow section,
a length of said solid section is at least fifteen percent of a length of said cantilevered portion,
a length of said hollow section is at least fifteen percent of said length of said cantilevered portion, and
said solid section is disposed between said attachment portion and said hollow section.

15. The test contactor of claim 14, wherein:
a first of said probes comprises a first notch in said solid section of its cantilevered beam portion;
a second of said probes comprises a second notch in said solid section of its cantilevered beam portion, which is longer than said cantilevered beam portion of said first probe; and
said first notch is sized relative to said second notch such that a scrub ratio of said first probe is approximately equal to a scrub ratio of said second probe.

16. The test contactor probe of claim 15, wherein said hollow section comprises a contiguous enclosure enclosing an interior space.

17. The test contactor of claim 16, wherein said beam structure comprises stacked layers substantially parallel to said second axis, wherein:
a first of said layers comprises a first beam component extending a length of said beam structure from said free end of said beam structure to an opposite end of said beam structure;
a second of said layers comprises a first spacer attached to said first beam component, a second spacer attached to said first beam component, and an empty space between said first spacer and said second spacer; and
a third of said layers comprises a second beam component attached to said first spacer and said second spacer, said empty space being between said first beam component and said second beam component.

18. The test contactor of claim 17, wherein:
said attachment portion comprises first end portions of said first beam component and said first spacer;
said solid section comprises interior portions of said first beam component said first spacer; and
said contiguous enclosure of said hollow section comprises an elongated end portion of said first beam component, a second end portion of said first spacer, said second spacer, and said second beam component.

19. The test contactor of claim 18, wherein:
said third layer further comprises a standoff attached to said first end portion of said first spacer; and
said attachment portion further comprises said standoff.

20. The test contactor of claim 19, wherein said second end of said post is directly attached to said standoff.

21. The test contactor of claim 17, wherein a fourth of said layers comprises a patch structure attached at least in part to an end of said second beam component that is attached to said first spacer.

22. The test contactor of claim 15 further comprising an electrically conductive contact structure attached to and extending from a free end of said beam structure,
wherein:
said post extends in a first direction along said first axis from a first side of said beam structure,
said contact structure extends in a second direction along a third axis from a second side of said beam structure, said third axis being substantially parallel to said first axis, and
said first direction is substantially opposite said second direction.

23. The test contactor of claim 22, wherein:
said cantilevered portion is free to move in response to a force of contact of a terminal of an electronic device with said contact structure such that said free end rotates with respect to said attachment portion of said beam structure, and
said cantilevered portion is resilient.

24. The test contactor of claim 15 further comprising an electrically conductive contact structure attached to and extending from a free end of said beam structure, wherein each of said probes is sized for said contact structure of said probe to contact a bond pad of a semiconductor die.

25. The electrical probe of claim 15, wherein said post and said beam structure are portions of a same monolithic structure.

26. The electrical probe of claim 1, wherein said post and said beam structure are portions of a same monolithic structure.

* * * * *